(12) United States Patent
Lee

(10) Patent No.: US 9,672,879 B1
(45) Date of Patent: Jun. 6, 2017

(54) PAGE BUFFER AND MEMORY DEVICE HAVING THE SAME

(71) Applicant: SK hynix Inc., Gyeonggi-do (KR)

(72) Inventor: Jong Hoon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/144,549

(22) Filed: May 2, 2016

(30) Foreign Application Priority Data

Dec. 10, 2015 (KR) ........................ 10-2015-0176172

(51) Int. Cl.
*G11C 7/10* (2006.01)
*G11C 7/12* (2006.01)
*G11C 7/14* (2006.01)
*G11C 7/22* (2006.01)

(52) U.S. Cl.
CPC .............. *G11C 7/12* (2013.01); *G11C 7/1006* (2013.01); *G11C 7/1051* (2013.01); *G11C 7/1072* (2013.01); *G11C 7/1078* (2013.01); *G11C 7/14* (2013.01); *G11C 7/22* (2013.01)

(58) Field of Classification Search
CPC ....... G11C 7/1051; G11C 7/22; G11C 7/1006; G11C 7/1078; G11C 7/1072
USPC .................................................. 365/189.05
See application file for complete search history.

(56) References Cited

U.S. PATENT DOCUMENTS

| 6,839,280 B1 * | 1/2005 | Chindalore | ............ B82Y 10/00 257/E21.209 |
| 8,503,246 B2 * | 8/2013 | Yoo | ........................ G11C 16/10 365/185.18 |
| 8,619,493 B2 * | 12/2013 | Kim | ...................... G11C 7/1045 365/185.11 |
| 9,230,981 B2 * | 1/2016 | Oh | ..................... H01L 27/11582 |
| 9,349,466 B2 * | 5/2016 | Kim | .................... G11C 11/5628 |

FOREIGN PATENT DOCUMENTS

| KR | 101012982 | 2/2011 |
| KR | 1020130037060 | 4/2013 |

* cited by examiner

*Primary Examiner* — Pho M Luu
(74) *Attorney, Agent, or Firm* — IP & T Group LLP

(57) ABSTRACT

There are provided a page buffer and a memory device having the same. A page buffer includes a reference current generation unit for precharging a bit line by generating a reference current, a current sensing unit for changing or maintaining a voltage of a select node, based on a change in current of the bit line, a first data sensing unit for storing first data, based on a change in the voltage of the select node, and a second data sensing unit for, when the first data is stored in the first data sensing unit, consecutively storing second data, based on the change in the voltage of the select node.

20 Claims, 8 Drawing Sheets

US 9,672,879 B1

PAGE BUFFER AND MEMORY DEVICE HAVING THE SAME

CROSS-REFERENCE TO RELATED APPLICATION

The present application claims a priority to a Korean patent application number 10-2015-0176172 filed on Dec. 10, 2015, which is incorporated herein in its entirety by reference.

BACKGROUND

1. Field

An aspect of the present disclosure relates to a page buffer and a memory device having the same and, more particularly, to a page buffer and a memory device having the same, which can reduce a sensing time in a read operation or a verify operation of the memory device.

2. Description of the Related Art

A memory system includes a memory device for storing data and a memory controller for controlling the memory device.

The memory controller controls the overall operations of the memory device, and also all command and data exchanges between a host and the memory device.

The host may communicate with the memory system by using an interface protocol, such as a peripheral component interconnect-express (PCI-E), an advanced technology attachment (ATA), a serial ATA (SATA), a parallel ATA (PATA), or a serial attached SCSI (SAS).

The memory controller controls the memory device in response to a host command received from the host. A plurality of storage devices included in the memory device may be operated simultaneously. However, when multiple operations requiring a large amount of current are simultaneously performed in a plurality of storage devices, the overall current consumption of the memory system may increase substantially at a rapid pace. Such spikes of current consumption may lead to an erroneous operation of the memory device due to a temporary current shortage. Therefore, the reliability of the memory system may be lowered.

SUMMARY

Embodiments of the present invention provide a page buffer and a memory device having the same, which can reduce a sensing time in a read operation or a verify operation.

According to an aspect of the present disclosure, there is provided a page buffer including: a reference current generation unit configured to precharge a bit line by generating a reference current; a current sensing unit configured to change or maintain a voltage of a select node, based on a change in current of the bit line; a first data sensing unit configured to store first data, based on a change in the voltage of the select node; and a second data sensing unit configured to, if the first data is stored in the first data sensing unit, consecutively store second data, based on the change in the voltage of the select node.

According to an aspect of the present disclosure, there is provided a page buffer including: a reference current generation unit configured to generate a reference current in a current sensing node in response to a reference current precharge signal and precharge a bit line coupled to the current sensing node; a current sensing unit configured to change or maintain a voltage of a select node in response to a change in current of the current sensing node and a sense amp strobe signal; a first switch configured to output the voltage of the select node as first data in response to a first select signal; a first sensing latch configured to store the first data; a second switch configured to output the voltage of the select node as second data in response to a second select signal; and a second sensing latch configured to store the second data.

According to an aspect of the present disclosure, there is provided a memory device including: a memory block configured to include a plurality of cell strings and store data; a peripheral circuit configured to store first data in selected memory cells included in the cell strings by performing a sensing operation using a first reference current, and store second data in the selected memory cells by performing a sensing operation using a second reference current lower than the first reference current; and a control circuit configured to control the peripheral circuit.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, exemplary embodiments of the present disclosure will be described in detail with reference to the accompanying drawings. However, the present disclosure is not limited to the described to embodiments but may be implemented into different forms. These embodiments are provided only for illustrative purposes and for full understanding of the present disclosure by those skilled in the art.

Figure 1:
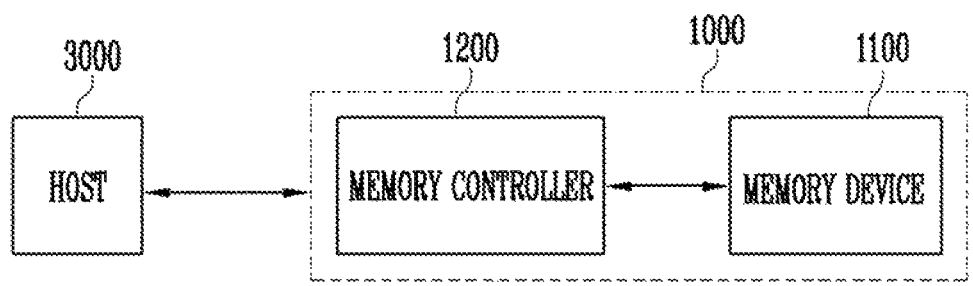
FIG. 1 is a diagram illustrating a memory system, according to an embodiment of the present disclosure.

Referring to FIG. 1 a memory system is provided, according to an embodiment of the present disclosure. [0024]

According to the embodiment of FIG. 1, the memory system 1000 may include a memory device 1100 and a memory controller 1200.

The memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a resistance random access memory (ReRAM), a spin torque transfer magnetic random access memory (STTMRAM), a phase-change random access memory (PCRAM), a flash memory and the like.

The memory controller 1200 controls the overall operations of the memory device 1100. For example, the memory controller 1200 may output a command for controlling the memory device 1100 and data in response to a command received from a host 3000 or may transmit data received from the memory device 1100 to the host 3000.

The host 3000 may communicate with the memory system 1000 by using an interface protocol, such as, for example, a peripheral component interconnect-express (PCI-E), an advanced technology attachment (ATA), a serial ATA (SATA), a parallel ATA (PATA), or a serial attached SCSI (SAS).

The memory device 1100 will be described in detail as follows.

Figure 2:
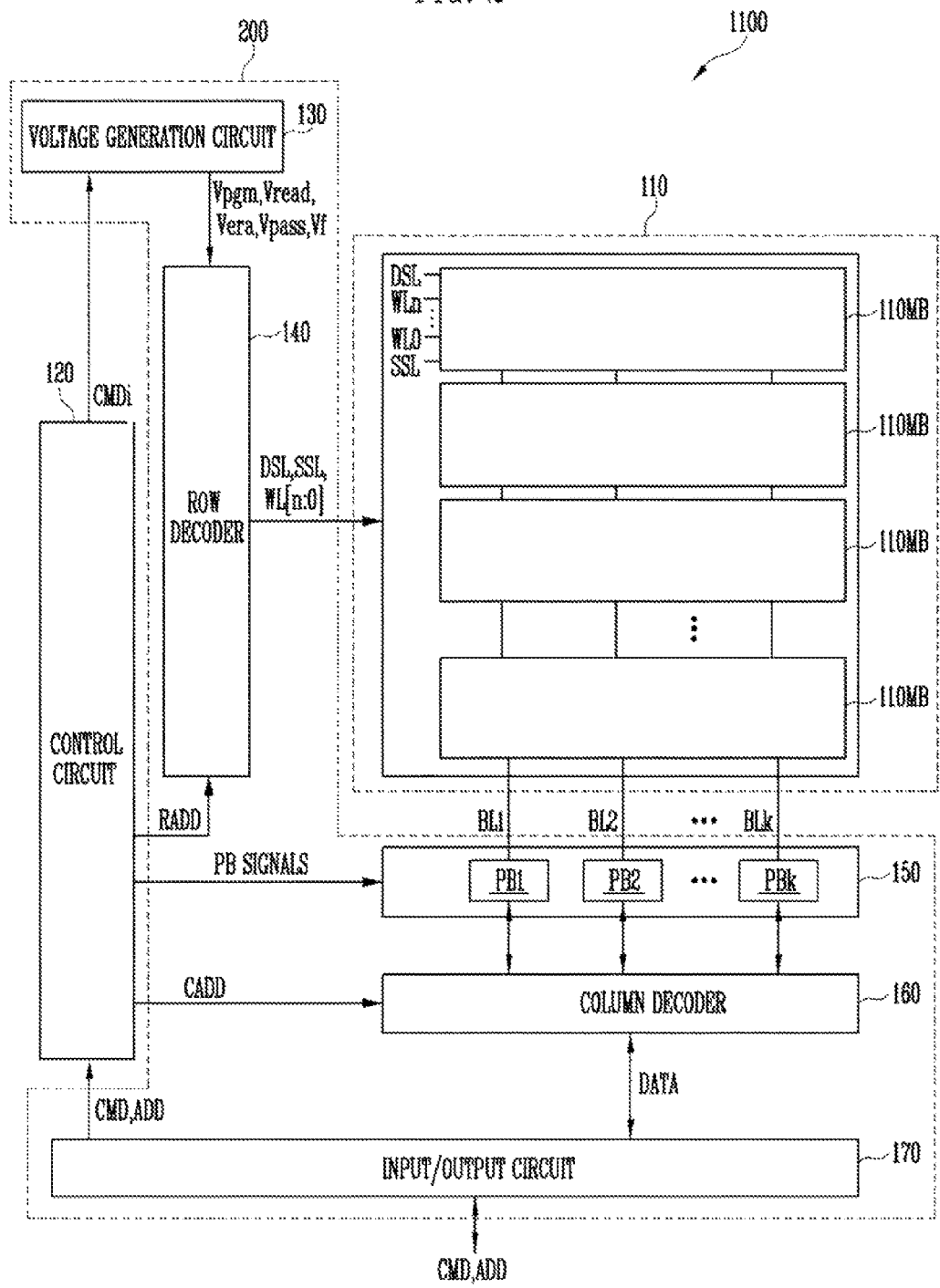
FIG. 2 is a diagram illustrating a memory device according to an embodiment of the present disclosure.

Referring to FIG. 2 the memory device 1100, according to an embodiment, includes a memory cell array 110 including a plurality of memory blocks 110MB, a peripheral circuit 200 for performing program, read, and erase operations of a selected memory block among the memory blocks 110MB, and a control circuit 120 for controlling the peripheral circuit 200. When the memory device 110 is a NAND flash memory device, the peripheral circuit 200 may include a voltage generation circuit 130, a row decoder 140, a page buffer group 150, a column decoder 160, and an input/output circuit 170.

The memory cell array 110 may include a plurality of memory blocks 110MB each memory block including a plurality of memory cells for storing data. The memory blocks 110MB are commonly coupled to bit lines BL1 to BLk (k is a positive integer). The memory blocks 110MB are coupled to source select lines SSL, word lines WL0 to WLn (n is a positive integer), and drain select lines DSL, respectively.

The control circuit 120 may output an internal command signal CMDi, a row address RADD, page buffer control signals PB_SIGNALS, and a column address CADD in response to a command CMD and an address ADD.

The voltage generation circuit 130 is coupled to the row decoder 140 through global lines. The voltage generation circuit 130 generates operation voltages required in a program, read, or test operation of the memory cells in response to an internal command signal CMDi and outputs the generated operation voltages to the global lines. For example, the voltage generation circuit 130 may generate a program voltage Vpgm, a read voltage Vread, an erase voltage Verase, a pass voltage Vpass, and a verify voltage Vf.

The row decoder 140 may transmit operation voltages generated by the voltage generation circuit 130 to a selected memory block 110MB. For example, the row decoder 140 may couple the global lines and local lines DSL, WL0 to WLn, and SSL of the selected memory block 110MB to each other so that the operation voltages generated by the voltage generation circuit 130 can be transmitted to the local lines DSL, WL0 to WLn, and SSL.

The page buffer group 150 may include a plurality of page buffers PB1 to PBk respectively coupled to the bit lines BL1 to BLk. The page buffers PB1 to PBk may arbitrarily store data or selectively precharge the bit lines BL1 to BLk in response to page buffer control signals PB_SIGNALS. In a read or verify operation, the page buffers PB1 to PBk may sense the current of the bit lines BL0 to BLk coupled to the selected memory block 110MB.

The column decoder 160 may select the page buffers PB1 to PBk included in the page buffer group 150 in response to a column address CADD. That is, the column decoder 160 may sequentially transmit, to the page buffers PB1 to PBk, data to be stored in the memory cells, or may transmit, to the input/output circuit 170, data of the to memory cells, arbitrarily stored in the page buffers PB1 to PBk.

The input/output circuit 170 may receive a command CMD and an address ADD from an external device, and transmit the received command CMD and address ADD to the control circuit 120. Also, the input/output circuit 170 may transmit/receive data DATA to/from the external device (e.g., the memory controller) or the column decoder 160.

Figure 3:
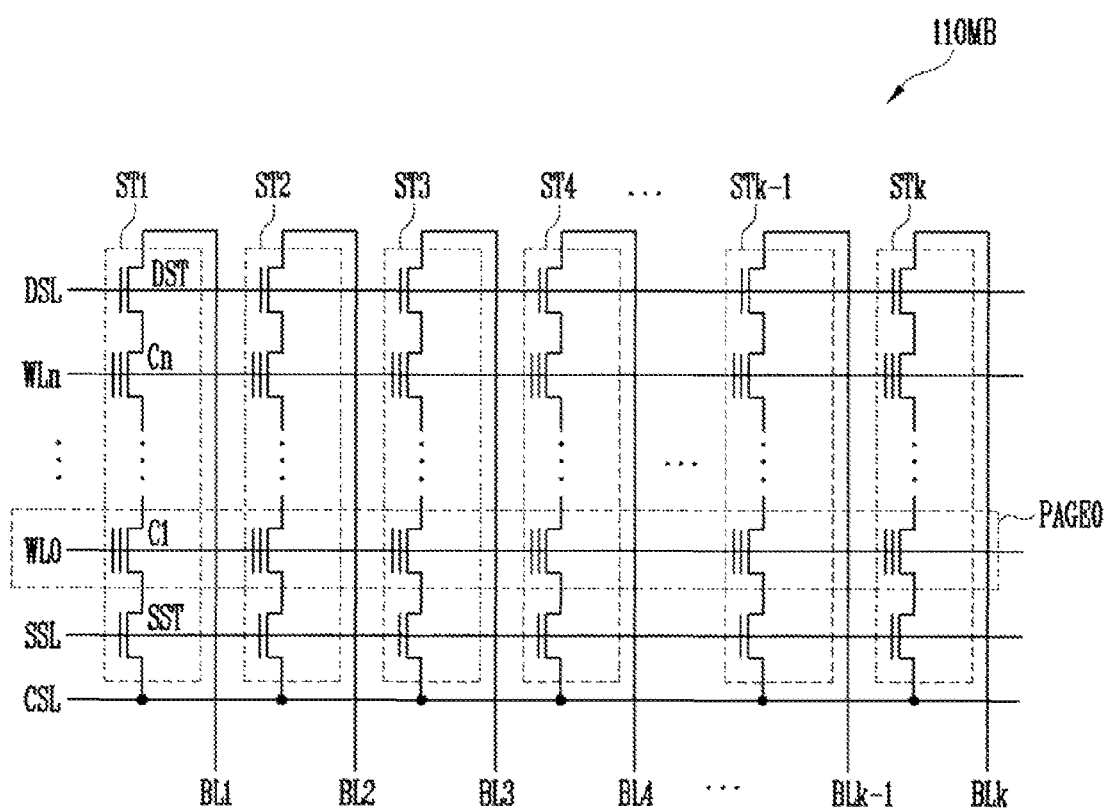
FIG. 3 is a circuit diagram illustrating an example configuration of any one of the memory blocks of the memory device of FIG. 2.

FIG. 3 is a circuit diagram illustrating any one of the memory blocks of FIG. 2. The memory blocks of FIG. 2 may be configured identically to one another, and therefore, only one of the memory blocks will be described as an example.

Referring to FIG. 3, the memory block 110MB includes a plurality of strings ST1 to STk coupled between bit lines BL1 to BLk and a common source line CSL. For example, the bit lines BL1 to BLk are respectively coupled to the strings ST1 to STk, and the common source line CSL is commonly coupled to the strings ST1 to STk.

The strings ST1 to STk may be configured identically to one another, hence a first string ST1 among the strings ST1 to STk will be described as an example.

The first string ST1 may include a source select transistor SST, a plurality of memory cells C1 to Cn, and a drain select transistor DST, which are coupled in series to each other between the common source line CSL and a first bit line BL1. A source of the source select transistor SST may be coupled to the common source line CSL, and a drain of the drain select transistor DST may be coupled to the first bit line BL1.

Gates of source select transistors SST coupled to different strings ST1 to STk are coupled to the source select line SSL, gates of the memory cells are respectively coupled to word lines WL0 to WLn, and gates of drain select transistors DST coupled to different strings ST1 to STk are coupled to a drain select line DSL.

The memory cells included in the memory block 110MB may be divided in units of physical pages or logical pages. For example, memory cells coupled to a word line (e.g., WL0) may constitute a physical page PAGE0. The page becomes a basic unit in a read or verify operation.

Figure 4:
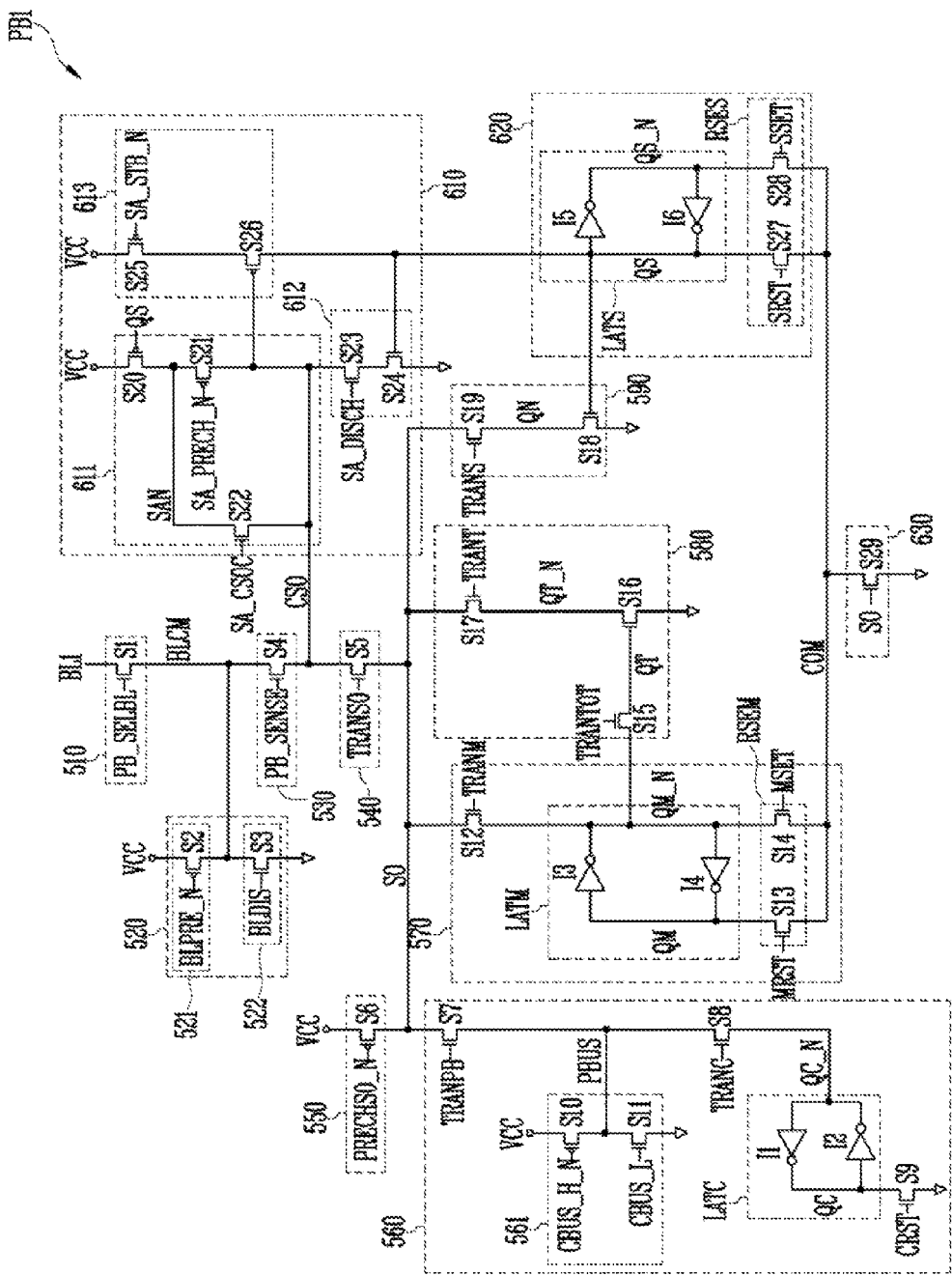
FIG. 4 is a circuit diagram illustrating a page buffer, according to an embodiment of the present disclosure.

FIG. 4 is a circuit diagram illustrating a page buffer PB1 according to an embodiment of the present disclosure. The page buffer PB1 may be one of the page buffers PB1 to PBk of FIG. 2, which may be configured identically to one another.

The first page buffer PB1 may operate in response to page buffer control signals PB_SIGNALS output from the control circuit 120 as best shown in FIG. 2. According to the embodiment of FIG. 4, signals PB_SELBL, PB_SENSE, BLPRE_N, BLDIS, SA_PRECH_N, SA_CSOC, SA_S-TB_N, SA_DISCH, PRECHSO_N, TRANPB, CBUS_H_N, CBUS_L, TRANC, CRST, TRANM, PBRST, MRST, MSET, TRANTOT, TRANT, TRANS, SRST, SA_ST, and SSET, which will be described below in detail, may be included in the page buffer control signals PB_SIG-NALS output from the control circuit 120.

The first page buffer PB1 will be described in detail as follows.

The first page buffer PB1, according to the embodiment of FIG. 4, may include a first bit line coupling unit 510, a bit line charge unit 520, a sensing unit 530, a sensing node coupling unit 540, a sensing node precharge unit 550, cache latch unit 560, a main latch unit 570, a dynamic latch unit 580, a third coupling unit 590, a current control unit 610, a sensing latch unit 620, and a discharge unit 630.

The bit line coupling unit 510 is coupled between a bit line BL1 and a bit line coupling node BLCM, and may include a first switch S1 operating in response to a bit line select signal PB_SELBL. The first switch S1 may be implemented with an NMOS transistor turned on or off in response to the bit line select signal PB_SELBL.

The bit line charge unit 520 may include a bit line precharge unit 521 and a bit line discharge unit 522.

The bit line precharge unit 521 is coupled between a power voltage VCC and the bit line coupling node BLCM, and may include a second switch S2 operating in response to a bit line precharge signal BLPRE_N. The second switch S2 may be implemented with a PMOS transistor turned on or off in response to the bit line precharge signal BLPRE_N.

The bit line discharge unit 522 is coupled between a ground voltage and the bit line coupling node BLCM, and may include a third switch S3 operating in response to a bit line discharge signal BLDIS. The third switch S3 may be implemented with an NMOS transistor turned on or off in response to the bit line discharge signal BLDIS.

The bit line sensing unit 530 is coupled between the bit line coupling node BLCM and a current sensing node CSO, and may include a fourth switch S4 operating in response to a bit line sensing signal PB_SENSE. The fourth switch S4 may be implemented with an NMOS transistor turned on or off in response to the bit line sensing signal PB_SENSE.

The sensing node coupling unit 540 is coupled between the current sensing node CSO and a sensing node SO, and may include a fifth switch S5 operating in response to a node coupling signal TRANSO. The fifth switch S5 may be implemented with an NMOS transistor turned on or off in response to the node coupling signal TRANSO.

The sensing node precharge unit 550 is coupled between the power voltage VCC and the sensing node SO, and may include a sixth switch S6 operating in response to a precharge signal PRECHSO_N. The sixth switch S6 may be implemented with a PMOS transistor turned on or off in response to the precharge signal PRECHSO_N.

The cache latch unit 560 may include seventh to ninth switches S7 to S9, a data transmission unit 561, and a cache latch LATC.

The seventh switch S7 may be implemented with an NMOS transistor coupling the sensing node SO and a page bus node PBUS to each other in response to a page data transmission signal TRANPB. The eighth switch S8 may be implemented with an NMOS transistor coupling the page bus node PBUS and a first cache node QC_N to each other in response to a cache data transmission signal TRANC.

The data transmission unit 561 may include tenth and eleventh switches S10 and S11 coupled in series to each other between the power voltage VCC and the ground voltage. The tenth switch S10 may be implemented with a PMOS transistor operating in response to a first bus signal CBUS_H_N. The eleventh switch S11 may be implemented with an NMOS transistor operating in response to a second bus signal CBUS_L. The page bus node PBUS is coupled between the tenth and eleventh switches S10 and S11.

The cache latch LATC may include first and second inverters I1 and I2. An input node of the first inverter I1 may be coupled to the first cache node QC_N, and an output node of the first inverter I1 may be coupled to a second cache node QC. An input node of the second inverter I2 may be coupled to the second cache node QC, and an output node of the second inverter I2 may be coupled to the first cache node QC_N. The ninth switch S9 may be implemented with an NMOS transistor capable of resetting the voltage of the second cache node QC to a low level in response to a cache reset signal CRST.

The main latch unit 570 may include a twelfth switch S12, a main latch LATM, and a main latch reset/setup unit RSEM. The twelfth switch S12 may be implemented with an NMOS transistor coupling the sensing node SO and a first main node QM_N of the main latch LATM to each other in response to a main data transmission signal TRANM.

The main latch LATM may include third and fourth inverters I3 and I4. The third and fourth inverters I3 and I4 may be coupled in parallel to each other between the fist main node QM_N and a second main node QM of the main latch LATM. An input node of the third inverter I3 may be coupled to the second main node QM, and an output node of the third inverter I3 may be coupled to the first main node QM_N. An input node of the fourth inverter I4 may be coupled to the first main node QM_N, and an output node of the fourth inverter I4 may be coupled to the second main node QM.

The main latch reset/setup unit RSEM is coupled to the first and second main nodes QM_N and QM of the main latch LATM, and may reset or set the main latch LATM. For example, the main latch reset/setup unit RSEM may include thirteenth and fourteenth switches S13 and S14. The thirteen switch S13 may be implemented with an NMOS transistor coupling the second main node QM of the main latch LATM and a common node COM to each other in response to a main reset signal MRST. The fourteenth switch S14 may be implemented with an NMOS transistor coupling the first main node QM_N of the main latch LATM and the common node COM to each other in response to a main setup signal MSET.

The dynamic latch unit 580 may arbitrarily store data transmitted from the main latch unit 570. For example, the dynamic latch unit 580 may include fifteenth to seventeenth switches S15 to S17. The fifteenth switch S15 may implemented with an NMOS transistor transmitting data stored in the first main node QM_N to a first dynamic node QT in response to a data transmission signal TRANTOT. The sixteenth switch S16 may be implemented with an NMOS transistor coupling a second dynamic node QT_N and the ground voltage to each other in response to data stored in the first dynamic node QT. The seventeenth switch S17 may be implemented with an NMOS transistor transmitting data transmitted to the second dynamic node QT_N to the sensing node SO in response to a dynamic data transmission signal TRANT.

The third coupling unit 590 is coupled between the sensing node SO and the sensing latch unit 620, and may change a voltage level of the sensing node SO in response to data stored in the sensing latch unit 620. For example, the third coupling unit 590 may include eighteenth and nineteenth switches S18 and S19. The eighteenth switch S18 may be implemented with an NMOS transistor coupling a transmission node QN and the ground voltage to each other in response to data stored in a first sensing node QS of the sensing latch unit 620. The nineteenth switch S19 may be implemented with an NMOS transistor coupling the transmission node QN and the sensing node SO to each other in response to a sensing data transmission signal TRANS.

The current control unit 610 may include a reference current generation unit 611, a discharge unit 612, and a current sensing unit 613. The reference current generation unit 611 may include twentieth to twenty-second switches S20 to S22. The twentieth switch S20 may be implemented with a PMOS transistor coupling the power voltage VCC and a sense amp node SAN to each other in response to data stored in the first sensing node QS. The twenty-first switch S21 may generate a reference current on the current sensing node CSO in response to a reference current precharge signal SA_PRECH_N. For example, the twenty-first switch S21 may be implemented with a PMOS transistor coupling the sense amp node SAN and the current sensing node CSO to each other. The twenty-second switch S22 may be implemented with an NMOS transistor coupling the sense amp node SAN and the current sensing node CSO to each other in response to a sense amp coupling signal SA_CSOC. The discharge unit 612 may discharge the current sensing node CSO in response to a sense amp discharge signal SA_DISCH and a voltage level of the first sensing node QS. For example, the discharge unit 612 may include twenty-third and twenty-fourth switches S23 and S24. The twenty-third switch S23 may be implemented with an NMOS transistor coupling the current sensing node CSO and the twenty-fourth switch S24 to each other in response to the sense amp discharge signal SADISCH. The twenty-fourth switch S24 may be implemented with an NMOS transistor coupling the twenty-third switch S23 and the ground voltage to each other in response to a voltage level of the first sensing node QS.

The current sensing unit 613 may couple the power voltage VCC and the first sensing node QS to each other in response to a voltage level of the current sensing node CSO and a sense amp strobe signal SA_STB_N. For example, the current sensing unit 613 may include twenty-fifth and twenty-sixth switches S25 and S26. The twenty-fifth switch S25 may be implemented with a PMOS transistor coupling the to power voltage VCC and the twenty-sixth switch S26 to each other in response to the sense amp strobe signal SA_STB_N. The twenty-sixth switch S26 may be implemented with a PMOS transistor coupling the twenty-fifth switch S25 and the first sensing node QS to each other in response to a voltage level of the current sensing node CSO.

The sensing latch unit 620 may include a sensing latch LATS and a sensing latch reset/setup unit RSES. The sensing latch LATS may include fifth and sixth inverters I5 and I6. The fifth and sixth inverters I5 and I6 may be coupled in parallel to each other between the first sensing node QS and a second sensing node QS_N of the sensing latch LATS. For example, an input node of the fifth inverter I5 may be coupled to the first sensing node QS, and an output node of the fifth inverter I5 may be coupled to the second sensing node QS_N. An input node of the sixth inverter I6 may be coupled to the second sensing node QS_N, and an output node of the sixth inverter I6 may be coupled to the first sensing node QS.

The sensing latch reset/setup unit RSES is coupled to the first and second sensing nodes QS and QS_N of the sensing latch LATS, and may reset or set the sensing latch LATS. For example, the sensing latch reset/setup unit RSES may include twenty-seventh and twenty-eighth switches S27 and S28. The twenty-seventh switch S27 may be implemented with an NMOS transistor coupling the first sensing node QS of the sensing latch LATS and the common node COM to each other in response to a sensing reset signal SRST. The twenty-eighth switch S28 may be implemented with an NMOS transistor coupling the second sensing node QS_N of the sensing latch LATS and the common node COM to each other in response to a sensing setup signal SSET.

The discharge unit 630 is coupled between the common node COM and a ground voltage, and may include a twenty-ninth transistor S29 discharging the common node COM according to a voltage level of the sensing node SO. The twenty-ninth switch S29 may be implemented with an NMOS transistor turned on or off according to the voltage level of the sensing node SO.

A read operation (or verify operation) of the first page buffer PB1 will be described as follows.

Setting Sensing Latch & Bit Line

The first sensing node QS of the sensing latch LATS is set to a low level, and the current flowing the bit line BL1 is set to a first reference current. For example, when the first sensing node QS of the sensing latch LATS is set to a low level, the twentieth switch 520 is turned on, so that a current flows in the sense amp node SAN. Subsequently, the bit line select signal PB_SELBL and the bit line sensing signal PB_SENSE obtain a high level, so that the first and fourth switches S1 and S4 are turned on. When the reference current precharge signal SA_PRECH_N has a first low level, the twenty-first switch S21 is turned on in response to the reference current precharge signal SA_PRECH_N. Therefore, the first reference current flows through the current sensing node CSO and the bit line BL1, and the bit line BL1 is precharged as the voltage level of the bit line BL1 becomes higher.

Sensing First Current

When a read voltage or a verify voltage is applied to a selected word line to which a selected memory cell is coupled, the current flowing in the bit line BL1 may be changed depending on a state of the selected memory cell. For example, when the threshold voltage of the selected memory cell is lower than the read voltage or the verify voltage, a channel is formed in the memory cell, and, therefore, the current is increased as the voltage level of the bit line BL1 becomes lower. When the threshold voltage of the selected memory cell is higher than the read voltage or the verify voltage, a channel is not formed in the memory cell, and, therefore, the current is decreased as the voltage level of the bit line BL1 stays the same. As described above, the current flowing in the bit line BL1 may stay the same as the first reference current or become higher than the first reference current according to the state of the selected memory cell.

The current flowing in the bit line BL1 is reflected to the current sensing node CSO, and the twenty-sixth switch S26 may be turned on or off according to a voltage level corresponding to the current of the current sensing node CSO. For example, when the current flowing in the current sensing node CSO becomes higher than the first reference current, the twenty-sixth switch S26 may be turned on.

Alternatively, when the current flowing in the current sensing node CSO stays the same as the first reference current or is decreased, to the twenty-sixth switch S26 may be turned off. In this state, when the sense amp strobe signal SA_STB_N having a low level is applied to the twenty-fifth switch S25, the twenty-fifth switch S25 is turned on. In this case, data of the first sensing node QS of the sensing latch LATS may be changed or may maintain a previous state depending on a turn-on or turn-off state of the twenty-sixth switch S26.

When a step of sensing a first current is performed, source bouncing may occur according to the states of memory cells included in a selected page. Therefore, when the step of sensing the first current is completed, a step of sensing a second current is performed to the same page. However, a step of setting the sensing latch LATS and the bit line BL1 is performed before the step of sensing the second current.

Setting Sensing Latch & Bit Line

While the step of sensing the first current is being performed, data of the sensing latch LATS may be changed, and therefore, the step of setting the sensing latch LATS and the bit line BL1 is further performed before the step of sensing the second current is performed. For example, the sensing latch LATS and the bit line BL1 may be set identically to when the step of sensing the first current is performed.

Sensing Second Current

The step of sensing the second current may be performed in the same manner as the step of sensing the first current, but a second reference current that is lesser than the first reference current used in the step of sensing the first current is used in the step of sensing the second current. That is, the step of sensing the first current may be performed to offset the source bouncing, and hence the step of sensing the second current becomes a main sensing step. Therefore, the first reference current may be set based on the second reference current.

Figure 5:
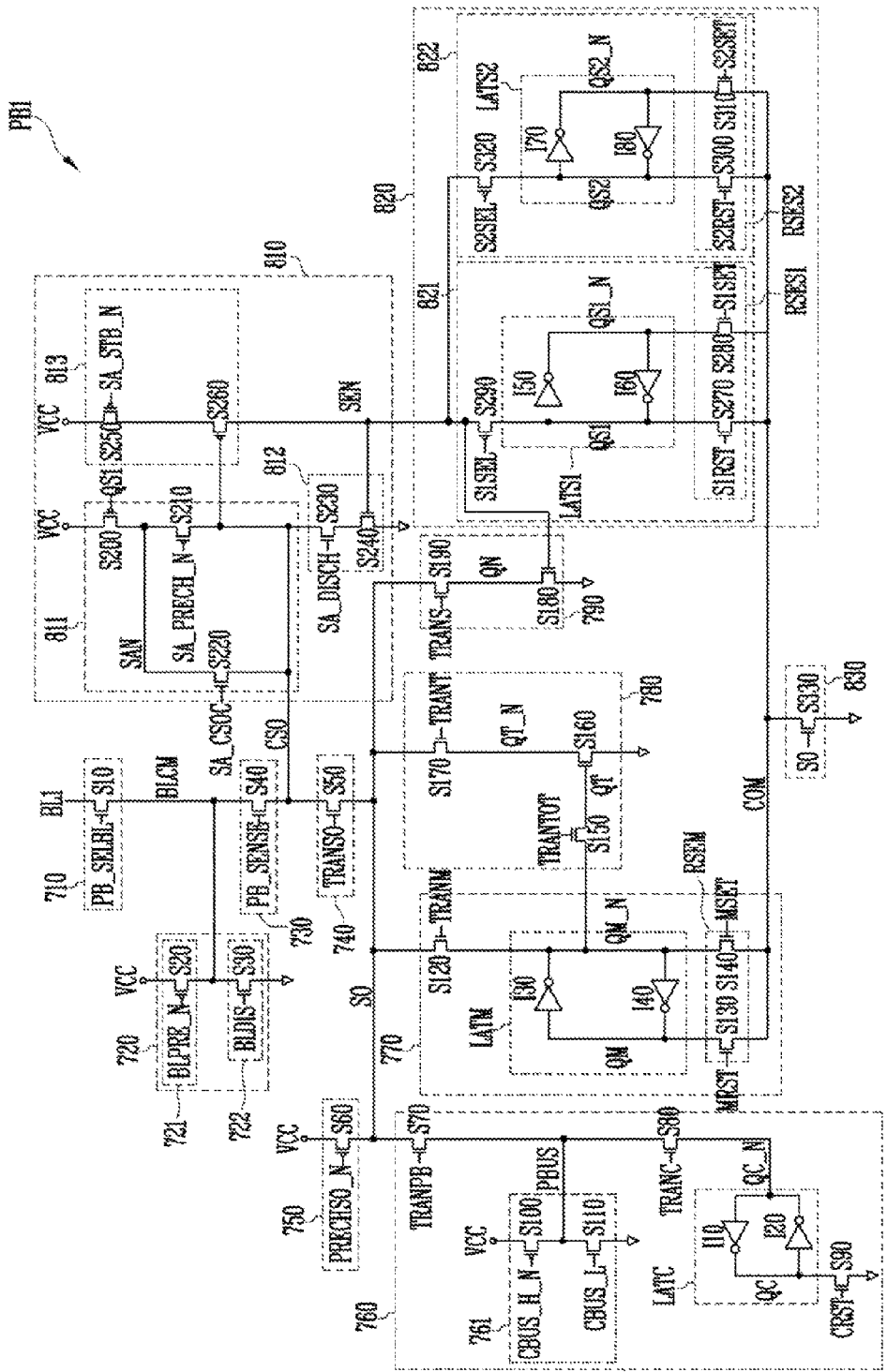
FIG. 5 is a circuit diagram illustrating a page buffer, according to another embodiment of the present disclosure.

FIG. 5 is a circuit diagram illustrating a page buffer PB1 according to another embodiment of the present disclosure. The page buffer PB1 may be one of the page buffers PB1 to PBk of FIG. 2, which may be configured identically to one another.

Referring to FIG. 5, the first page buffer PB1 may operate in response to page buffer control signals PB_SIGNALS output from the control circuit 120. Signals PB_SELBL, PB_SENSE, BLPRE_N, BLDIS, SA_PRECH_N, SA_CSOC, SA_STB_N, SA_DISCH, PRECHSO_N, TRANPB, CBUS_H_N, CBUS_L, TRANC, CRST, TRANM, PBRST, MRST, MSET, TRANTOT, TRANT, TRANS, SISEL, S1RST, SA_ST, SiSET, S2SEL, S2RST, and S2SET, which will be described below, may be include in the page buffer control signals PB_SIGNALS output from the control circuit 120.

The first page buffer PB1 will be described in detail as follows.

The first page buffer PB1 may include a first bit line coupling unit 710, a bit line charge unit 720, a sensing unit 730, a sensing node coupling unit 740, a sensing node precharge unit 750, cache latch unit 760, a main latch unit 770, a dynamic latch unit 780, a third coupling unit 790, a current control unit 810, a sensing latch unit 820, and a discharge unit 830.

The bit line coupling unit 710 is coupled between a bit line BL1 and a bit line coupling node BLCM, and may include a first switch S10 operating in response to a bit line select signal PB_SELBL. The first switch S10 may be implemented with an NMOS transistor turned on or off in response to the bit line select signal PB_SELBL.

The bit line charge unit 720 may include a bit line precharge unit 721 and a bit line discharge unit 722.

The bit line precharge unit 721 is coupled between a power voltage VCC and the bit line coupling node BLCM, and may include a second switch S20 operating in response to a bit line precharge signal BLPRE_N. The second switch S20 may be implemented with a PMOS transistor turned on or off in response to the bit line precharge signal BLPRE_N.

The bit line discharge unit 722 is coupled between a ground voltage and the bit line coupling node BLCM, and may include a third switch S30 operating in response to a bit line discharge signal BLDIS. The third switch S30 may be implemented with an NMOS transistor turned on or off in response to the bit line discharge signal BLDIS.

The bit line sensing unit 730 is coupled between the bit line coupling node BLCM and a current sensing node CSO, and may include a fourth switch S40 operating in response to a bit line sensing signal PB_SENSE. The fourth switch S40 may be implemented with an NMOS transistor turned on or off in response to the bit line sensing signal PB_SENSE.

The sensing node coupling unit 740 is coupled between the to current sensing node CSO and a sensing node SO, and may include a fifth switch S50 operating in response to a node coupling signal TRANSO. The fifth switch S50 may be implemented with an NMOS transistor turned on or off in response to the node coupling signal TRANSO.

The sensing node precharge unit 750 is coupled between the power voltage VCC and the sensing node SO, and may include a sixth switch S60 operating in response to a precharge signal PRECHSO_N. The sixth switch S60 may be implemented with a PMOS transistor turned on or off in response to the precharge signal PRECHSO_N.

The cache latch unit 760 may include seventh to ninth switches S70 to S90, a data transmission unit 761, and a cache latch LATC.

The seventh switch S70 may be implemented with an NMOS transistor coupling the sensing node SO and a page bus node PBUS to each other in response to a page data transmission signal TRANPB. The eighth switch S80 may be implemented with an NMOS transistor coupling the page bus node PBUS and a first cache node QC_N to each other in response to a cache data transmission signal TRANC. The data transmission unit 561 may include tenth and eleventh switches S100 and S110 coupled in series to each other between the power voltage VCC and the ground voltage. The tenth switch S100 may be implemented with a PMOS transistor operating in response to a first bus signal CBUS_H_N. The eleventh switch S110 may be implemented with an NMOS transistor operating in response to a second bus signal CBUS_L. The page bus node PBUS is coupled between the tenth and eleventh switches S100 and S110.

The cache latch LATC may include first and second inverters 110 and 120. An input node of the first inverter 110 may be coupled to the first cache node QC_N, and an output node of the first inverter I10 may be coupled to a second cache node QC. An input node of the second inverter I20 may be coupled to the second cache node QC, and an output node of the second inverter I20 may be coupled to the first cache node QC_N. The ninth switch S90 may be implemented with an NMOS transistor capable of resetting a voltage level of the second cache node QC to a low level in response to a cache reset signal CRST.

The main latch unit 770 may include a twelfth switch S120, a main latch LATM, and a main latch reset/setup unit RSEM.

The twelfth switch S120 may be implemented with an NMOS transistor coupling the sensing node SO and a first main node QM_N of the main latch LATM to each other in response to a main data transmission signal TRANM.

The main latch LATM may include third and fourth inverters 130 and 140. The third and fourth inverters I30 and 140 may be coupled in parallel to each other between the fist main node QM_N and a second main node QM of the main latch LATM. An input node of the third inverter I30 may be coupled to the second main node QM, and an output node of the third inverter I30 may be coupled to the first main node QM_N. An input node of the fourth inverter I40 may be coupled to the first main node QM_N, and an output node of the fourth inverter I40 may be coupled to the second main node QM.

The main latch reset/setup unit RSEM is coupled to the first and second main nodes QM_N and QM of the main latch LATM, and may reset or set the main latch LATM. For example, the main latch reset/setup unit RSEM may include thirteenth and fourteenth switches S130 and S140. The thirteen switch S130 may be implemented with an NMOS transistor coupling the second main node QM of the main latch LATM and a common node COM to each other in response to a main reset signal MRST. The fourteenth switch S140 may be implemented with an NMOS transistor coupling the first main node QM_N of the main latch LATM and the common node COM to each other in response to a main setup signal MSET.

The dynamic latch unit 780 may arbitrarily store data transmitted from the main latch unit 770. For example, the dynamic latch unit 780 may include fifteenth to seventeenth switches S150 to S170.

The fifteenth switch S150 may implemented with an NMOS transistor transmitting data stored in the first main node QM_N to a first dynamic node QT in response to a data transmission signal TRANTOT. The sixteenth switch S160 may be implemented with an NMOS transistor coupling a second dynamic node QT_N and the ground voltage to each other in response to data stored in the first dynamic node QT. The seventeenth switch S170 may be implemented with an NMOS transistor transmitting data transmitted to the second dynamic node QT_N to the sensing node SO in response to a dynamic data transmission signal TRANT.

The third coupling unit 790 is coupled between the sensing node SO and the sensing latch unit 820, and may store data in response to a voltage level of a select node SEN. For example, the third coupling unit 790 may include eighteenth and nineteenth switches S180 and S190. The eighteenth switch S180 may be implemented with an NMOS transistor storing data in a transmission node QN in response to the voltage level of the select node SEN. The nineteenth switch S190 may be implemented with an NMOS transistor coupling the transmission node QN and the sensing node SO to each other in response to a sensing data transmission signal TRANS.

The current control unit 810 may include a reference current generation unit 811, a discharge unit 812, and a current sensing unit 813.

The reference current generation unit 811 may include twentieth to twenty-second switches S200 to S220. The twentieth switch S200 may be implemented with a PMOS transistor coupling the power voltage VCC and a sense amp node SAN to each other in response to data stored in a first sensing node QS1. The twenty-first switch S210 may generate a reference current on the current sensing node CSO in response to a reference current precharge signal SA_PRECH_N. For example, the twenty-first switch S210 may be implemented with a PMOS transistor coupling the sense amp node SAN and the current sensing node CSO to each other. The twenty-second switch 220 may be implemented with an NMOS transistor coupling the sense amp node SAN and the current sensing node CSO to each other in response to a sense amp coupling signal SA_CSOC. The discharge unit 812 may discharge the current sensing node CSO in response to a sense amp discharge signal SA_DISCH and a voltage level of the first sensing node QS1. For example, the discharge unit 812 may include twenty-third and twenty-fourth S230 and S240. The twenty-third switch S230 may be implemented with an NMOS transistor coupling the current sensing node CSO and the twenty-fourth switch S240 to each other in response to the sense amp discharge signal SA_DISCH. The twenty-fourth switch S240 may be implemented with an NMOS transistor coupling the twenty-third switch S230 and the ground voltage to each other in response to the voltage level of the select node SEN.

The current sensing unit 813 may couple the power voltage VCC and the select node SEN to each other in response to a voltage level of the current sensing node CSO and a sense amp strobe signal SA_STB_N. For example, the current sensing unit 813 may include twenty-fifth and twenty-sixth switches S250 and S260. The twenty-fifth switch S250 may be implemented with a PMOS transistor coupling the power voltage VCC and the twenty-sixth switch S260 to each other in response to the sense amp strobe signal SA_STB_N. The twenty-sixth switch S260 may be implemented with a PMOS transistor coupling the twenty-fifth switch S250 and the select node SEN to each other in response to the voltage level of the current sensing node CSO. The select node SEN may be discharged in an initialization operation.

The sensing latch unit 820 may include a first data sensing unit 821 and a second data sensing unit 822.

The first data sensing unit 821 may include a twenty-ninth switch S290, a first sensing latch LATS1, and a first sensing latch preset/setup unit RSES1. The twenty-ninth switch S290 may be implemented with a PMOS transistor coupling the select node SEN and the first sensing node QS1 to each other in response to a first select signal S1SEL. The first sensing latch LATS1 may include fifth and sixth inverters I50 and I60. The fifth and sixth inverters I50 and I60 may be coupled in parallel to each other between the first sensing node QS1 and a second sensing node QS1_N of the first sensing latch LATS1. For example, an input node of the fifth inverter I50 may be coupled to the first sensing node QS1, and an output node of the fifth inverter I50 may be coupled to the second sensing node QS1_N. An input node of the sixth inverter I60 may be coupled to the second sensing node QS1_N, and an output node of the sixth inverter I60 may be coupled to the first sensing node QS1.

The first sensing latch reset/setup unit RSES1 is coupled to the first and second sensing nodes QS1 and QS1_N of the first sensing latch LAST1, and may reset or set the first sensing latch LATS1. For example, the first sensing latch reset/setup unit RSES1 may include twenty-seventh and twenty-eighth switches S270 and S280. The twenty-seventh switch S270 may be implemented with an NMOS transistor coupling the first sensing node QS1 of the first sensing latch LATS1 and the common node COM to each other in response to a first sensing reset signal S1RST. The twenty-eighth switch S280 may be implemented with an NMOS transistor coupling the second sensing node QS1_N of the first sensing latch LATS1 and the common node COM to each other in response to a first sensing setup signal S1SET.

The second data sensing unit 822 may include a thirty-second switch S320, a second sensing latch LATS2, and a second sensing latch reset/setup unit RSES2. The thirty-second switch S320 may be implemented with a PMOS transistor coupling the select node SEN and a third sensing node QS2 to each other in response to a second select signal S2SEL. The second sensing latch LATS2 may include seventh and eighth inverters I70 and I80. The seventh and eighth inverters I70 and I80 may be coupled in parallel to each other between the third sensing node QS2 and a fourth sensing node QS2_N of the second sensing latch LATS2.

For example, an input node of the seventh inverter I70 may be coupled to the third sensing node QS2, and an output node of the seventh inverter I70 may be coupled to the fourth sensing node QS2_N. An input node of the eighth inverter I80 may be coupled to the fourth sensing node QS2_N, and an output node of the eighth inverter I80 may be coupled to the third sensing node QS2.

The second sensing latch reset/setup unit RSES2 is coupled between the third and fourth sensing nodes QS2 and QS2_N of the second sensing latch LATS2, and may reset or set the second sensing to latch LATS2. For example, the second sensing latch reset/setup unit RSES2 may include thirtieth and thirty-first switches S300 and S310. The thirtieth switch S300 may be implemented with an NMOS transistor coupling the third sensing node QS2 of the second sensing latch LATS2 and the common node COM to each other in response to a second sensing reset signal S2RST. The thirty-first switch S310 may be implemented with an NMOS transistor coupling the fourth sensing node QS2_N of the second sensing latch LATS2 and the common node COM to each other in response to a second sensing setup signal S2SET.

The discharge unit 830 is coupled between the common node COM and the ground voltage, and may include a thirty-third switch S330 discharging the common node COM according to a voltage level of the sensing node SO. The thirty-third switch S330 may be implemented with an NMOS transistor turned on or off according to the voltage level of the sensing node SO.

A read operation (or verify operation) of the first page buffer PB1 will be described as follows.

Setting Sensing Latch & Bit Line

The first and third sensing nodes QS1 and QS2 of the first and second sensing latches LATS1 and LATS2 are set to a low level, and the current flowing in the bit line BL1 is set to a first reference current. For example, when the first sensing node QS1 of the first sensing latch LATS1 is set to a low level, the twentieth switch S200 is turned on, so that a current flows in the sense amp node SAN. Subsequently, the bit line select signal PB_SELBL and the bit line sensing signal PB_SENSE obtain a high level, so that the first and fourth switches S10 and S40 are turned on. When the reference current precharge signal SA_PRECH_N has a low level, the twenty-first switch S210 is turned on in response to the reference current precharge signal SA_PRECH_N. Therefore, the first reference current flows through the current sensing node CSO and the bit line BL1, and the bit line BL1 is precharged as the voltage level of the bit line BL1 becomes higher.

Sensing First Current

When a read voltage or verify voltage is applied to a selected word line to which a selected memory cell is coupled, the current flowing in the bit line BL1 may be changed depending on a state of the selected memory cell. For example, when the threshold voltage of the selected memory cell is lower than the read voltage or the verify voltage, a channel is formed in the memory cell, and therefore, the current is increased as the voltage level of the bit line BL1 becomes lower. When the threshold voltage of the selected memory cell is higher than the read voltage or the verify voltage, the channel is not formed in the memory cell, and therefore, the current is decreased as the voltage level of the bit line BL1 stays the same. As described above, the current flowing in the bit line BL1 may keep the same as the first reference current or become higher than the first reference current according to the state of the selected memory cell.

The current flowing in the bit line BL1 is reflected to the to current sensing node CSO, and the twenty-sixth switch S260 may be turned on or turned off according to a voltage level corresponding to the current of the current sensing node CSO. For example, when the current flowing in the current sensing node CSO becomes higher than the first reference current, the twenty-sixth switch S260 may be turned on.

Alternatively, when the current flowing in the current sensing node CSO stays the same as the first reference current or is decreased, the twenty-sixth switch S260 may be turned off. In this state, when the twenty-ninth switch S290 of the first data sensing unit 821 is turned on in response to the first select signal S1SEL, the select node SEN and the first sensing node QS1 are coupled to each other, so that the thirty-second switch S320 of the second data sensing unit 822 is turned off. When the sense amp strobe signal SA_STB_N having a low level is applied to the twenty-fifth switch S250, the twenty-fifth switch S250 is turned on, and data of the first sensing node QS1 of the first sensing latch LATS1 may be changed or may maintain a previous state depending on a turn-on or turn-off state of the twenty-sixth switch S260.

When a step of sensing a first current is performed, source bouncing may occur according to the states of memory cells included in a selected page. Therefore, when the step of sensing the first current is completed, a step of sensing a second current is performed on the same page.

Sensing Second Current

In this embodiment, a step of setting the first sensing latch LATS1 and the bit line BL1 may not be performed between the step of sensing the first current and the step of sensing the second current. For example, when the step of sensing the first current is completed, the step of sensing the second current is immediately performed using the second sensing latch LATS2. That is, the step of sensing the second current is performed in the second sensing latch LATS2 different from the first sensing latch LATS1, and thus the step of setting the first sensing latch LATS1 and the bit line BL1 may not be performed.

Specifically, when the step of sensing the first current is completed, a level of the first select signal S1SEL is changed from a low level to a high level, so that the twenty-ninth switch S290 is turned off. Subsequently, the second select signal S2SEL is changed from a high level to a low level. When the second select signal S2SEL is changed to a low level, the thirty-second switch S320 of the second data sensing unit 822 is turned on, so that the select node SEN and the third sensing node QS2 are coupled to each other. When the sense amp strobe signal SA_STB_N having a low level is applied to the twenty-fifth switch S250, the twenty-fifth switch S250 is turned on, and data of the third sensing node QS2 of the second sensing latch LATS2 may be changed or may maintain a previous state depending on a turn-on or turn-off state of the twenty-sixth switch S260. However, a second reference current lesser than the first reference current used in the step of sensing the first current is used in the step of sensing the second current. That is, the step of sensing the first current may be performed to offset the source bouncing, and hence, the step of sensing the second current becomes a main sensing step. Therefore, the first reference current may be set based on the second reference current.

As described above, the step of setting the first sensing latch LATS1 and the bit line BL1 is not performed, and the steps of sensing the first and second current are consecutively performed so that the time required for the read operation (or verify operation) may be reduced.

Figure 6:
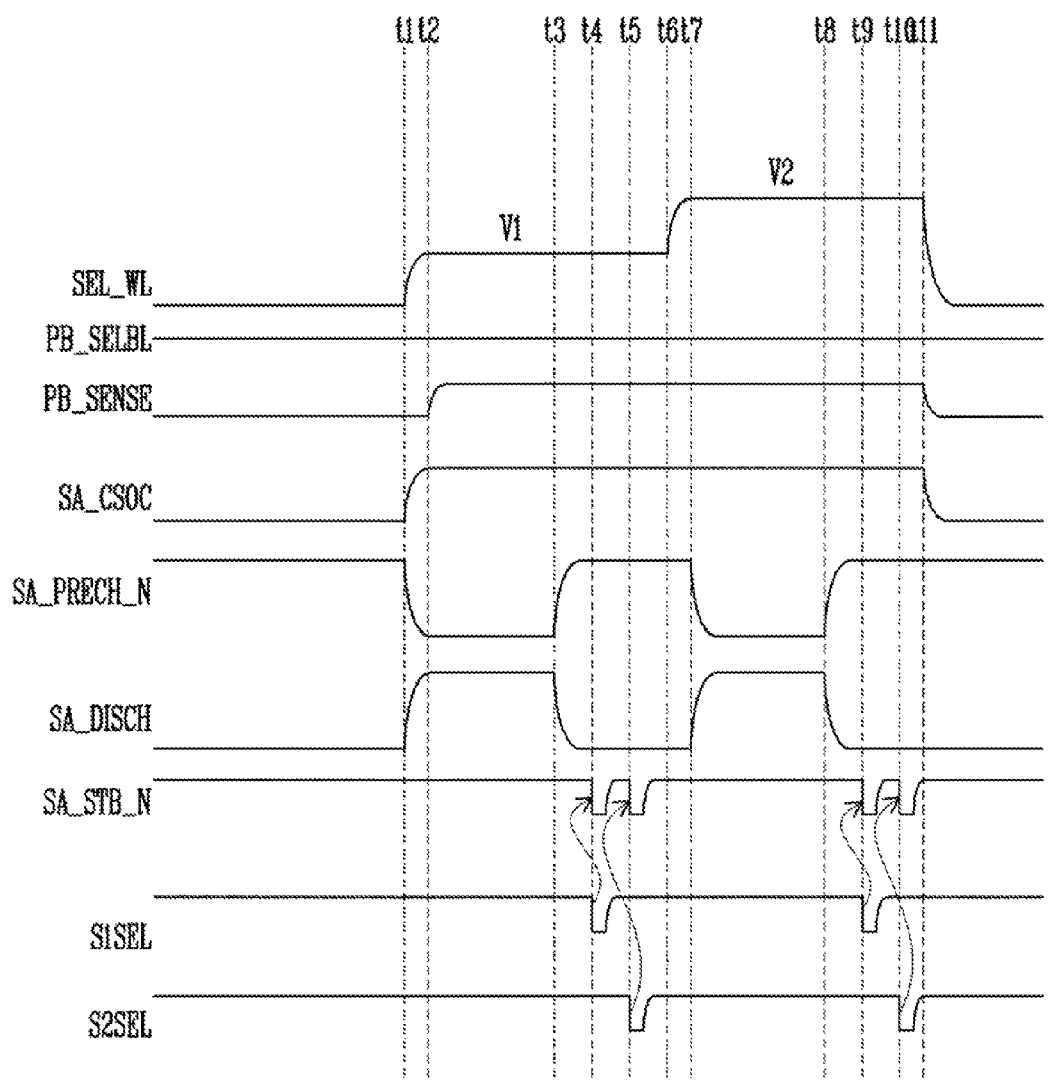
FIG. 6 is a diagram illustrating an operating method of the page buffer illustrated in FIG. 5.

FIG. 6 is a diagram illustrating in detail an operating method of the page buffer illustrated in FIG. 5. A verify operation performed in a program operation will be described as an example.

Referring to FIG. 6, while the verify operation is being performed, the bit line select signal PB_SELBL stays to a high level, so that the first switch S10 is turned on.

When a first verify operation is started, a first verify voltage V1 is applied to a selected word line SEL_WL at time point t1. When the voltage level of the selected word line SEL_WL reaches the first verify voltage V1, the bit line sensing signal PB_SENSE and the sense amp coupling signal SA_CSOC are changed from a low level to a high level, so that the fourth switch S40 and the twenty-second switch S220 are turned on. In this state, the reference current precharge signal SA_PRECH_N is changed from a low level to a high level, and the sense amp discharge signal SA_DISCH is changed from a low level to a high level, so that the twenty-first and twenty-third switches S210 and S230 are turned on. Therefore, the bit line BL1 and the current sensing node CSO are coupled to each other, and thus a voltage of the bit line BL1 is transmitted to the current sensing node CSO. The twenty-sixth switch S260 may be turned on or off according to a voltage of the current sensing node CSO. While the twenty-sixth switch S260 can be turned on or off during a predetermined time (e.g., between time points t2 and t3), the reference precharge signal SA_PRECH_N is changed from a low level to a high level, and the sense amp discharge signal SA_DISCH is changed from a high level to a low level, so that the twenty-first switch S210 and the twenty-third switch S230 are turned off. Subsequently, a first sensing operation is performed at time point t4.

When the first sensing operation is started at time point t4, the first select signal S1SEL is changed from a high level to a low level, and the second select signal S2SEL stays to a high level. Thus, the first sensing latch LATS1 is selected, and the second sensing latch LATS2 is unselected. When the sense amp strobe signal SA_STB_N is toggled to a low level while the first sensing latch LATS1 is selected, data may be stored in the first sensing node QS1 according to a turn-on or turn-off state of the twenty-sixth switch S260. It is assumed that value of '1' as initialization data is stored in the first sensing node QS1 before the sensing operation is performed. When the twenty-sixth switch S260 is turned off, the voltage or current of the select node SEN is not changed, and therefore, data '1' stays the same in the first sensing node QS1. When the twenty-sixth switch S260 is turned on, the select node SEN is coupled to the power voltage VCC. Therefore, as the voltage or current of the select node SEN is changed, the data of the first sensing node QS1 is changed to '0,' and the first sensing operation is ended. When the first sensing operation is ended, the first select signal S1SEL and the sense amp strobe signal SA_STB_N are changed from a high level to a low level. However, since the reliability of the first sensing operation during time points t4 and t5 is low, a second sensing operation is subsequently performed during time points t5 and t6.

When the second sensing operation is started at time point t5, the first select signal S1SEL stays to a high level, and the second select signal S2SEL is changed from a high level to a low level. Thus, the second sensing latch LATS2 is selected, and the first sensing latch LATS1 is unselected. When the sense amp strobe signal SA_STB_N is toggled to a low level while the second sensing latch LATS2 is selected, data may be stored in the third sensing node QS2 according to a turn-on or turn-off state of the twenty-sixth switch S260. It is assumed, as an example, that a value of '1' as initialization data is stored in the third sensing node QS2 before the sensing operation is performed. When the twenty-sixth switch S260 is turned off, the voltage or current of the select node SEN is not changed, and therefore, data '1' stays the same in the third sensing node QS2. When the twenty-sixth switch S260 is turned on, the select node SEN is coupled to the power voltage VCC. Therefore, as the voltage or current of the select node SEN is changed, the data of the third sensing node QS2 is changed to '0.'

As described above, when the first and second sensing operations are consecutively performed, repeated operations of precharging the bit line BL1 and the like are omitted between the first and second sensing operations, thereby reducing a sensing operation time.

When the first verify operation using the first verify voltage V1 is ended at time point t6, a second verify operation using another verify voltage may be consecutively performed. For example, the second verify operation using a second verify voltage V2 which is higher than the first verify voltage V1 may be performed during time points t6 to t11.

The second verify operation during time points t6 to t11 may be performed in the same manner as the first verify operation during time points t1 to t6 except that the second verify voltage V2 is applied to the selected word line SEL_WL, and therefore, its detailed description will be omitted. In the second verify operation, a first sensing operation is performed during time points t9 and t10, and a second sensing operation is consecutively performed during time points t10 and t11. Thus, the time required to perform the second verify operation can also be reduced.

An operation to which the above-described verify operation is applied will be described as follows.

Figure 7:
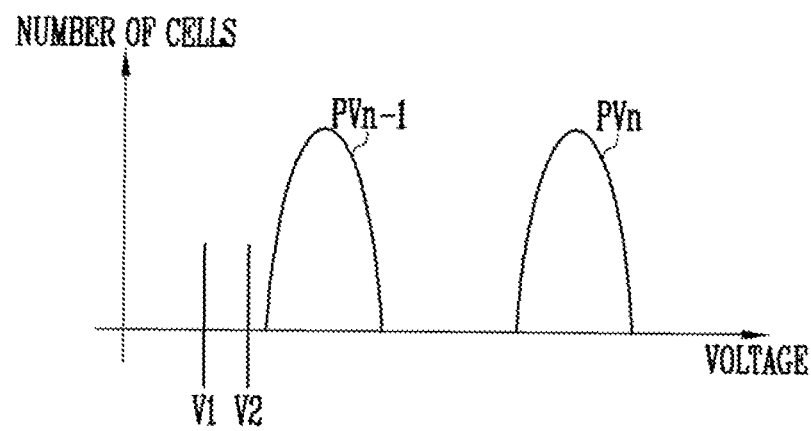
FIGS. 7 and 8 are diagrams illustrating an application of the operating method of FIG. 6.
Figure 8:
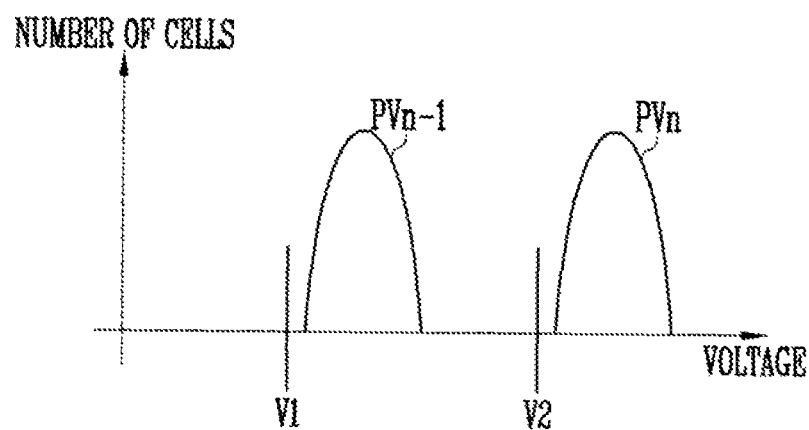

FIGS. 7 and 8 are diagrams illustrating an embodiment to which the operating method is applied.

Referring to FIG. 7, the verify operation described with reference to FIG. 6 may be performed during a program operation with a double verify operation. In the double verify operation, the second verify voltage V2 may be a target voltage of a target threshold voltage distribution PVn−1, and the first verify voltage V1 which is lower than the second verify voltage V2 may be a pre-verify voltage set to narrow a threshold voltage distribution by decreasing the program speed of memory cells, voltage levels of which are close to the target voltage. That is, the first and second verify voltages V1 and V2 may be used in a verify operation of the target threshold voltage distribution PVn−1 while verify voltages higher than the first and second verify voltages V1 and V2 may be used in a verify operation of another threshold voltage distribution PVn.

Referring to FIG. 8, the verify operation described with reference to FIG. 6 may be applied to a program operation with a normal verify operation. In the normal verify operation, the first verify voltage V1 may be a target voltage of an (n−1)th target threshold voltage distribution PVn−1, and the second verify operation V2 higher than the first verify voltage V1 may be a target voltage of an nth target threshold voltage distribution PVn higher than the (n−1)th target threshold voltage distribution PVn−1.

Figure 9:
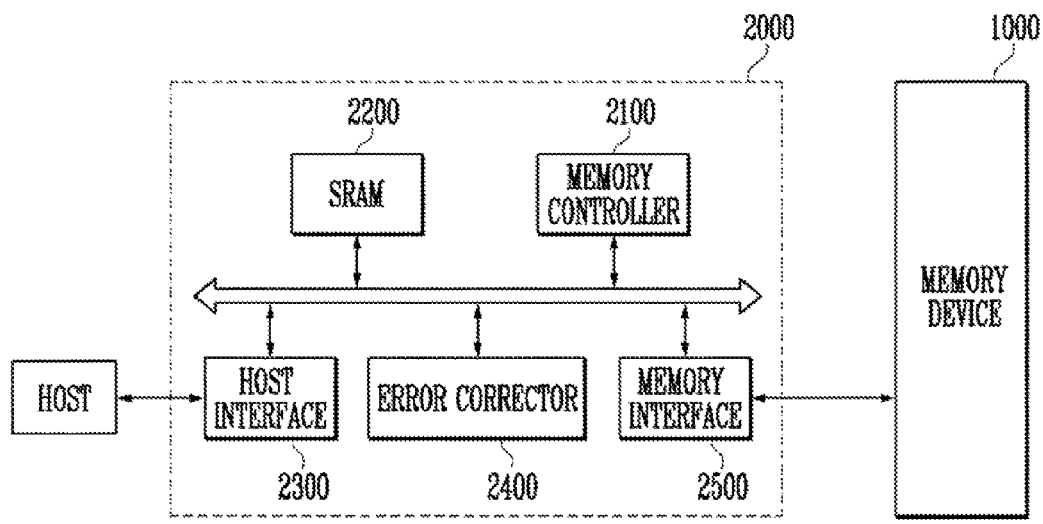
FIG. 9 is a diagram illustrating a memory system, according to another embodiment of the present disclosure.

FIG. 9 is a diagram illustrating a memory system, according to another embodiment of the present disclosure.

According to the embodiment of FIG. 9, the memory system may include a memory device 1000, a controller 2000, and a host.

The controller 2000 may include a memory controller 2100, an SRAM 2200, a host interface 2300, an error corrector 2400, and a memory interface 2500.

The memory controller 2100 may control the memory device 1000. The SRAM 2200 may be used as a working memory of the memory controller 2100. The host interface 2300 may be provided with a data exchange protocol of the host coupled to the controller 20000. The error corrector 2400 may detect and correct errors included in data read out from the memory device 1000. The memory interface 2500 may interface with the memory device 1000. The memory controller 2100 may perform a control operation for data exchange between the controller 2000 and the memory device 1000. Although not shown in this figure, the controller 20000 may further include a ROM (not shown) for storing code data for interfacing with the host.

The memory system may be applied to a computer, an ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, one of various electronic devices that constitute a home network, and the like.

Figure 10:
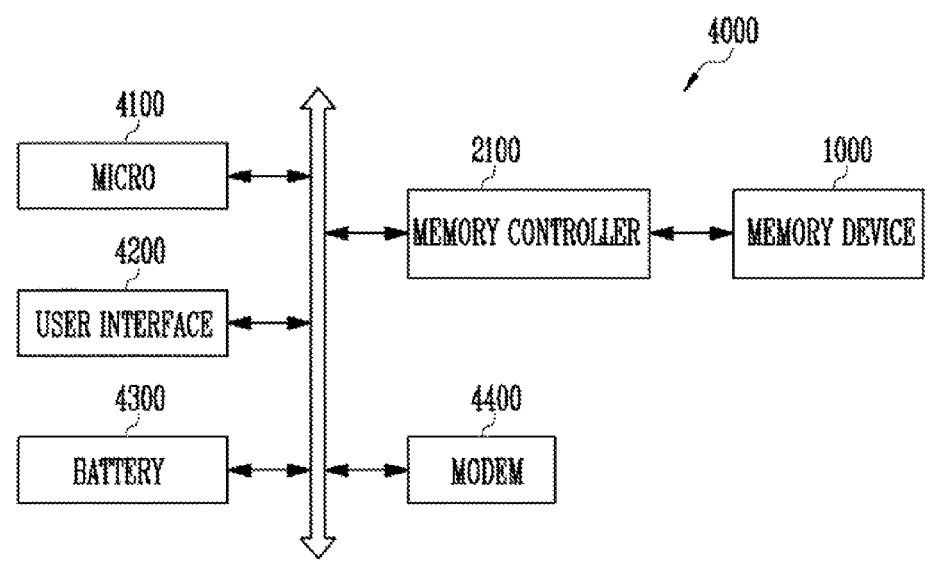
FIG. 10 is a diagram illustrating a memory system according to still another embodiment of the present disclosure.

FIG. 10 is a diagram illustrating a memory system according to still another embodiment of the present disclosure.

According to the embodiment of FIG. 10, the memory system may include a memory device 1000, a memory controller 2100, a micro 4100, and a user interface 4200, which are electrically coupled to a bus. When the memory system is a mobile device, a battery 4300 for supplying operation voltages of the memory system may be additionally provided in the memory system. Although not shown in this figure, the memory system may further include an application chip set, a camera image processor (CIS), a mobile DRAM, and the like.

The memory controller 2100 and the memory device 1000 may constitute a solid state drive/disk (SSD).

The memory device 1000 and the memory controller 2100 may be packaged in various forms. For example, the memory device 1000 and the memory controller 2100 may be packaged as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), wafer-level processed stack package (WSP), and the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, to characteristics, and/or elements described in connection with a particular embodiment may be used singly or in combination with features, characteristics, and/or elements described in connection with other embodiments unless otherwise specifically indicated. Accordingly, it will be understood by those of skill in the relevant art that various changes in form and details may be made without departing from the spirit and/or scope of the present disclosure as set forth in the following claims.

What is claimed is:

1. A page buffer comprising:
   a reference current generation unit suitable for precharging a bit line by generating a reference current;
   a current sensing unit suitable for changing or maintaining a voltage of a select node based on a change in current of the bit line;
   a first data sensing unit suitable for storing first data based on a change in the voltage of the select node; and
   a second data sensing unit suitable for, when the first data is stored in the first data sensing unit, consecutively storing second data based on the change in the voltage of the select node.

2. The page buffer of claim 1, wherein the reference current generation unit is coupled between a power voltage and a current sensing node coupled to the bit line, and allows the reference current to flow in the bit line.

3. The page buffer of claim 1,
   wherein, when the current of the bit line is greater than the reference current, the current sensing unit outputs a positive voltage to the select node, and
   wherein, when the current of the bit line is lesser than the reference current, the current sensing unit maintains the select node to a previous state.

4. The page buffer of claim 3, wherein, before the current sensing unit operates, the select node is initialized to a discharge state.

5. The page buffer of claim 1, wherein the first data sensing unit includes:
   a first sensing latch suitable for storing the first data; and
   a second switch suitable for transmitting, to the first sensing latch, the voltage of the select node as the first data.

6. The page buffer of claim 5, wherein the second switch is turned on when the first data is stored in the first sensing latch, and is turned off after the first data is stored in the first sensing latch.

7. The page buffer of claim 1, wherein the second data sensing unit includes:
   a second sensing latch suitable for storing the second data; and
   a third switch suitable for transmit, to the second sensing latch, the voltage of the select node as the second data.

8. The page buffer of claim 7, wherein the third switch is turned on when the second data is stored in the second sensing latch, and is turned off after the second data is stored in the second sensing latch.

9. The page buffer of claim 1, wherein the first data and the second data are sensed from the same memory cell through different reference currents.

10. The page buffer of claim 9, wherein the second data is sensed through a lower reference current than the first data.

11. A page buffer comprising:
    a reference current generation unit suitable for generating a reference current on a current sensing node in response to a reference current precharge signal, and precharging a bit line coupled to the current sensing node;
    a current sensing unit suitable for changing or maintaining a voltage of a select node in response to a change in current of the current sensing node and a sense amp strobe signal;
    a first switch suitable for outputting the voltage of the select node as first data in response to a first select signal;
    a first sensing latch suitable for storing the first data;

a second switch suitable for outputting the voltage of the select node as second data in response to a second select signal; and a second sensing latch suitable for storing the second data.

12. The page buffer of claim 11, wherein the reference current generation unit includes:
   a third switch suitable for coupling a power voltage and a sense amp node to each other in response to a voltage of a first sensing node of the first sensing latch; and
   a fourth switch suitable for coupling the sense amp node and the current sensing node to each other in response to a reference current precharge signal.

13. The page buffer of claim 11, wherein the current sensing unit includes:
   a fifth switch operable in response to the sense amp strobe signal; and
   a sixth switch operable in response to current flowing in the current sensing node.

14. The page buffer of claim 13,
   wherein the fifth switch couples the power voltage and the sixth switch to each other in response to the sense amp strobe signal, and
   wherein the sixth switch transmits, to the select node, a voltage transmitted from the sixth switch, in response to current flowing in the current sensing node.

15. The page buffer of claim 14, wherein the select node is discharged in an initialization operation.

16. The page buffer of claim 11, further comprising:
   a first sensing latch reset/setup unit suitable for resetting or setting the first sensing latch; and
   a second sensing latch reset/setup unit suitable for resetting or setting the second sensing latch.

17. A memory device comprising:
   a memory block including a plurality of cell strings, and suitable for storing data;
   a peripheral circuit suitable for storing first data of selected memory cells included in the cell strings by performing a sensing operation using a first reference current, and then consecutively storing second data of the selected memory cells by performing a sensing operation using a second reference current lesser than the first reference current; and
   a control circuit suitable for controlling the peripheral circuit.

18. The memory device of claim 17, wherein the peripheral circuit includes:
   a voltage generation circuit suitable for generating a read voltage in response to an internal command signal;
   a row decoder suitable for transmitting the read voltage to a selected word line coupled to a selected memory block in response to a row address;
   a page buffer group suitable for storing the first data read from the selected memory cells, and then consecutively storing the second data in response to a page buffer control signal; and
   a column decoder suitable for outputting the second data stored in the page buffer group in response to a column address.

19. The memory device of claim 18, wherein the page buffer group includes a plurality of page buffers suitable for storing the first data and the second data.

20. The memory device of claim 19, wherein each of the page buffer includes:
   a first sensing latch suitable for storing the first data; and
   a second sensing latch suitable for storing the second data.

* * * * *